United States Patent
Lee et al.

(10) Patent No.: US 7,970,066 B1
(45) Date of Patent: Jun. 28, 2011

(54) TRACKING AUTOMATIC GAIN CONTROL OF ORTHOGONAL FREQUENCY DOMAIN MULTIPLEXING SYSTEMS

(75) Inventors: Jungwon Lee, Cupertino, CA (US); Qing Zhao, Santa Clara, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 759 days.

(21) Appl. No.: 11/963,294

(22) Filed: Dec. 21, 2007

Related U.S. Application Data

(60) Provisional application No. 60/882,062, filed on Dec. 27, 2006.

(51) Int. Cl.
   *H04L 27/28* (2006.01)
(52) U.S. Cl. ...................................................... 375/260
(58) Field of Classification Search .................. 375/260, 375/245, 316, 130, 147, 340, 349, 345; 370/442, 370/465; 455/234.1, 240.1, 327.1; 330/278
See application file for complete search history.

(56) References Cited

U.S. PATENT DOCUMENTS

| | | | |
|---|---|---|---|
| 7,065,165 B2 * | 6/2006 | Heinonen et al. | 375/345 |
| 2008/0080626 A1 * | 4/2008 | Lawrence et al. | 375/260 |
| 2008/0130799 A1 * | 6/2008 | Yousef et al. | 375/345 |
| 2008/0130801 A1 * | 6/2008 | Wang | 375/345 |
| 2008/0144726 A1 * | 6/2008 | Ingber et al. | 375/240.28 |
| 2010/0080327 A1 * | 4/2010 | Zhang et al. | 375/345 |

OTHER PUBLICATIONS

IEEE Std 802.16e™-2005 and IEEE Std 802.16™-2004/Cor1-2005 (Amendment and Corrigendum to IEEE Std 802.16-2004); IEEE Standard for Local and metropolitan area networks; Part 16: Air Interface for Fixed and Mobile Broadband Wireless Access Systems; Amendment 2: Physical and Medium Access Control Layers for Combined Fixed and Mobile Operation in Licensed Bands and Corrigendum 1; IEEE Computer Society and IEEE Microwave Theory and Techniques Society; Sponsored by the LAN/MAN Standards Committee; Feb. 28, 2006; 861 pages.

* cited by examiner

*Primary Examiner* — Khai Tran

(57) ABSTRACT

A system includes an input, a variable gain amplifier (VGA), and an automatic gain control (AGC) module. The input receives an input signal. The input signal includes frames of N symbols modulated using orthogonal frequency division multiplexing (OFDM), wherein a cyclic prefix (CP) precedes each of the N symbols, and wherein N is an integer greater than 1. The VGA provides a gain when amplifying the input signal. The AGC module selectively adjusts the gain of the VGA during the CP preceding M of the N symbols, wherein M is an integer greater than 1.

26 Claims, 17 Drawing Sheets

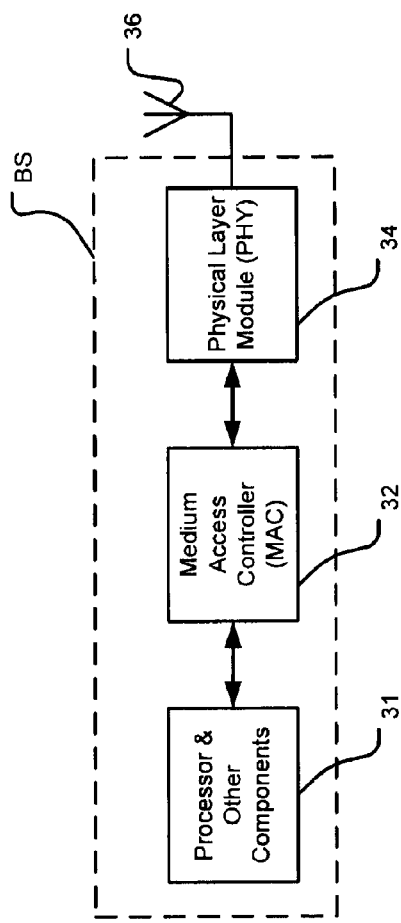
FIG. 2B
_Prior Art_
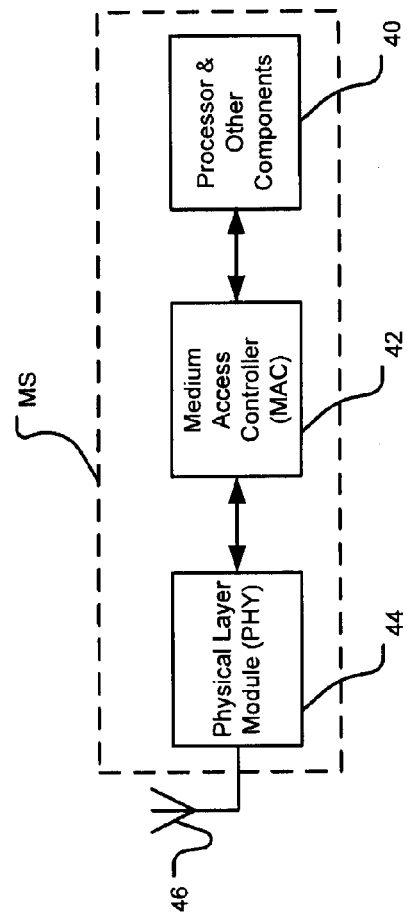
FIG. 2C
_Prior Art_

|  | First AGC Tracking System | Second AGC Tracking System | Third AGC Tracking System | Fourth AGC Tracking System |
|---|---|---|---|---|
| Channel Fading Margin Rating of ADC Module | 0 dB | 0 dB | 3 dB | 0 dB |
| Quantization Noise of OFDM Receiver | Large | Smallest | Smallest | Small |
| Computational Complexity of Channel Estimation Module | Moderate | High | Low | Moderate |

FIG. 9

TRACKING AUTOMATIC GAIN CONTROL OF ORTHOGONAL FREQUENCY DOMAIN MULTIPLEXING SYSTEMS

CROSS-REFERENCE TO RELATED APPLICATIONS

This application claims the benefit of U.S. Provisional Application No. 60/882,062, filed on Dec. 27, 2006. The disclosure of the above application is incorporated herein by reference in its entirety.

FIELD

The present disclosure relates to communication systems, and more particularly to tracking automatic gain control (AGC) in systems using orthogonal frequency domain multiplexing (OFDM).

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly nor impliedly admitted as prior art against the present disclosure.

Referring now to FIG. 1, a typical communication system 10 comprises an information source 12, a transmitter 13, a communication channel 20, a receiver 27, and a destination 28. The transmitter 13 comprises a source encoder 14, a channel encoder 16, and a modulator 18. The receiver 27 comprises a demodulator 22, a channel decoder 24, and a source decoder 26.

The information source 12 may be an analog source such as a sensor that outputs information as continuous waveforms or a digital source such as a computer that outputs information in a digital form. The source encoder 14 converts the output of the information source 12 into a sequence of binary digits (bits) called an information sequence u. The channel encoder 16 converts the information sequence u into a discrete encoded sequence v called a codeword. The modulator 18 transforms the codeword into a waveform of duration T seconds that is suitable for transmission.

The waveform output by the modulator 18 is transmitted via the communication channel 20. Typical examples of the communication channel 20 are telephone lines, wireless communication channels, optical fiber cables, etc. Noise, such as electromagnetic interference, inter-channel crosstalk, etc., may corrupt the waveform.

The demodulator 22 receives the waveform. The demodulator 22 processes each waveform and generates a received sequence r that is either a discrete (quantized) or a continuous output. The channel decoder 24 converts the received sequence r into a binary sequence u' called an estimated information sequence. The source decoder 26 converts u' into an estimate of the output of the information source 12 and delivers the estimate to the destination 28. The estimate may be a faithful reproduction of the output of the information source 12 when u' resembles u despite decoding errors that may be caused by the noise.

Communication systems use different modulation schemes to modulate and transmit data. For example, a radio frequency (RF) carrier may be modulated using techniques such as frequency modulation, phase modulation, etc. In wireline communication systems, a transmitted signal generally travels along a path in a transmission line between a transmitter and a receiver. In wireless communication systems, however, a transmitted signal may travel along multiple paths. This is because the transmitted signal may be reflected and deflected by objects such as buildings, towers, airplanes, cars, etc., before the transmitted signal reaches a receiver. Each path may be of different length. Thus, the receiver may receive multiple versions of the transmitted signal. The multiple versions may interfere with each other causing inter symbol interference (ISI). Thus, retrieving original data from the transmitted signal may be difficult.

To alleviate this problem, wireless communication systems often use a modulation scheme called orthogonal frequency division multiplexing (OFDM). In OFDM, a wideband carrier signal is converted into a series of independent narrowband sub-carrier signals that are adjacent to each other in frequency domain. Data to be transmitted is split into multiple parallel data streams. Each data stream is modulated using a sub-carrier. A channel over which the modulated data is transmitted comprises a sum of the narrowband sub-carrier signals, which may overlap.

When each sub-carrier closely resembles a rectangular pulse, modulation can be easily performed by Inverse Discrete Fourier Transform (IDFT), which can be efficiently implemented as an Inverse Fast Fourier Transform (IFFT). When IFFT is used, the spacing of sub-carriers in the frequency domain is such that when the receiver processes a received signal at a particular frequency, all other signals are nearly zero at that frequency, and ISI is avoided. This property is called orthogonality, and hence the modulation scheme is called orthogonal frequency division multiplexing (OFDM).

Referring now to FIGS. 2A-2C, a wireless communication system 30 may comprise base stations BS1, BS2, and BS3 (collectively BS) and one or more mobile stations (MS). In FIG. 2A, one MS may communicate with up to three adjacent base stations. Each BS may transmit data that is modulated using an orthogonal frequency division multiplexing access (OFDMA) system. In FIG. 2B, each BS may comprise a processor 31, a medium access controller (MAC) 32, a physical layer (PHY) module 34, and an antenna 36. In FIG. 2C, each MS may comprise a processor 40, a medium access controller (MAC) 42, a physical layer (PHY) module 44, and an antenna 46. The PHY modules 34 and 44 may comprise radio frequency (RF) transceivers (not shown) that transmit and receive data via antennas 36 and 46, respectively. Each BS and MS may transmit and receive data while the MS moves relative to the BS.

Specifically, each BS may transmit data typically in three segments: SEG1, SEG2, and SEG3. The MS may move relative to each BS and may receive data from one or more base stations depending on the location of the MS relative to each BS. For example, the MS may receive data from SEG 3 of BS1, SEG 2 of BS2, and/or SEG 1 of BS3 when the MS is located as shown in FIG. 2A. Relative motion between MS and BS may cause Doppler shifts in signals received by the MS. Since systems using OFDMA are inherently sensitive to carrier frequency offsets (CFO), pilot tones are generally used for channel estimation refinement. For example, some of the sub-carriers may be designated as pilot tones for correcting residual frequency offset errors.

Additionally, the PHY module 34 of each BS typically adds a preamble to a data frame that is to be transmitted. Specifically, the PHY module 34 modulates and encodes the data frame comprising the preamble at a data rate specified by the MAC 34 and transmits the data frame. When the PHY module 44 of the MS receives the data frame, the PHY module 44 uses the preamble in the data frame to detect a beginning of packet transmission and to synchronize to a transmitter clock of the BS.

According to the I.E.E.E. standard 802.16e, which is incorporated herein by reference in its entirety, a first symbol in the data frame transmitted by the BS is a preamble symbol from a preamble sequence. The preamble sequence typically contains an identifier called IDcell, which is a cell ID of the BS, and segment information. The BS selects the preamble sequence based on the IDcell and the segment number of the BS. Each BS may select different preamble sequences. Additionally, each BS may select preamble sequences that are distinct among the segments of that BS. The BS modulates multiple sub-carriers with the selected preamble sequence. Thereafter, the BS performs IFFT, adds a cyclic prefix, and transmits a data frame. The MS uses the cyclic prefix to perform symbol timing and fractional carrier frequency synchronization.

When a receiver in the MS is turned on (i.e., when the MS is powered up), the MS may associate with an appropriate segment of a corresponding BS depending on the location of the MS. The MS may detect a preamble sequence in the data frame transmitted by the BS. Then the MS may perform frame synchronization and retrieve an IDcell and a segment number of the BS from the data frame.

Specifically, when the receiver in the MS is turned on, the MS initially performs symbol timing and carrier frequency synchronization before the MS can detect a preamble sequence. The MS may perform these tasks using a cyclic prefix in the data frame. Thereafter, the MS determines whether a first symbol in the frame is a preamble symbol. If the first symbol is a preamble symbol, then the MS determines which preamble sequence is present in the frame. Once the MS determines the preamble sequence, the MS can associate with a corresponding segment of an appropriate BS.

Base stations and mobile stations may be configured to operate in WiMAX wireless networks. WiMAX is a standards-based technology enabling wireless broadband access as an alternative to wired broadband like cable and DSL. WiMAX provides fixed, nomadic, portable, and mobile wireless connectivity without the need for a direct line-of-sight with a base station. WiMAX technology may be incorporated in portable electronic devices including notebook computers, personal digital assistants (PDAs).

Mobile WiMAX supports a full range of smart antenna technologies, including beamforming and spatial multiplexing, to enhance system performance. Mobile WiMAX supports adaptive switching between these options to maximize the benefit of smart antenna technologies under different channel conditions. Smart antenna technologies typically involve complex vector and matrix operations on signals due to multiple antennas. Typically, base stations may have at least two transmit antennas but may transmit preamble symbols via only one transmit antenna. Mobile stations may have at least two receive antennas and may receive signals via more than one receive antenna.

SUMMARY

A system comprises an input, a variable gain amplifier (VGA), and an automatic gain control (AGC) module. The input receives an input signal comprising frames of N symbols modulated using orthogonal frequency division multiplexing (OFDM), wherein a cyclic prefix (CP) precedes each of the N symbols, and wherein N is an integer greater than 1. The VGA provides a gain when amplifying the input signal.

The AGC module selectively adjusts the gain of the VGA during the CP preceding M of the N symbols, wherein M is an integer greater than 1.

In another feature, M=N.

In another feature, a settling time of the VGA is less than a period of the CP.

In another feature, the AGC module changes the gain of the VGA based on signal strength of the input signal.

In another feature, the system further comprises a channel estimation module that generates a channel estimate for one of the N symbols based on a plurality of the N symbols.

In another feature, the system further comprises a gain adjuster module, wherein the AGC module changes gain of the gain adjuster module in inverse proportion to a change in the gain of the VGA. The channel estimate is independent of the change in the gain of the VGA.

In another feature, the channel estimation module updates channel estimates of the N symbols when the AGC module changes the gain of the VGA.

In another feature, when signal strength of the input signal changes by a factor of F, the AGC module changes the gain of the VGA by (10 log F) and the channel estimation module updates channel estimates of the N symbols, where F is an integer greater than 2. The channel estimation module updates the channel estimates using a binary shift operation.

In another feature, the system further comprises a gain adjuster module, wherein when the AGC module changes the gain of the VGA by G dB, the AGC module changes gain of the gain adjuster module by $((-G)+((\text{Round}(G/(10 \log F)))*(10 \log F)))$dB, and the channel estimation module updates channel estimates of the N symbols when signal strength of the input signal changes by a factor of F, where F is an integer greater than 1.

In another feature, an OFDM receiver comprises the system and further comprises a decoder module that decodes the N symbols without the CP.

In another feature, the decoder module generates noise variance correction based on information generated by the AGC module.

In still other features, a method comprises receiving an input signal that includes frames of N symbols modulated using orthogonal frequency division multiplexing (OFDM), wherein a cyclic prefix (CP) precedes each of the N symbols, and wherein N is an integer greater than 1. The method further comprises providing a variable gain amplifier (VGA) having a gain when amplifying the input signal. The method further comprises selectively adjusting the gain of the VGA during the CP preceding M of the N symbols by providing automatic gain control (AGC), wherein M is an integer greater than 1.

In another feature, M=N.

In another feature, the method further comprises providing the VGA having a settling time less than a period of the CP.

In another feature, the method further comprises changing the gain of the VGA based on signal strength of the input signal by using the AGC.

In another feature, the method further comprises generating a channel estimate for one of the N symbols based on a plurality of the N symbols.

In another feature, the method further comprises providing a gain adjuster module and changing gain of the gain adjuster module in inverse proportion to a change in the gain of the VGA by using the AGC. The channel estimate is independent of the change in the gain of the VGA.

In another feature, the method further comprises updating channel estimates of the N symbols when the AGC changes the gain of the VGA.

In another feature, the method further comprises changing the gain of the VGA by (10 log F) using the AGC and updating channel estimates of the N symbols when signal strength of the input signal changes by a factor of F, where F is an integer greater than 2. The method further comprises updating the channel estimates using a binary shift operation.

In another feature, the method further comprises providing a gain adjuster module, changing gain of the gain adjuster module by ((−G)+((Round(G/(10 log F)))*(10 log F)))dB by using the AGC when the gain of the VGA is changed by G dB, and updating channel estimates of the N symbols when signal strength of the input signal changes by a factor of F, where F is an integer greater than 1.

In another feature, the method further comprises decoding the N symbols without the CP.

In another feature, the method further comprises generating noise variance correction based on information generated by the AGC.

In still other features, a system comprises input means for receiving an input signal that includes frames of N symbols modulated using orthogonal frequency division multiplexing (OFDM), wherein a cyclic prefix (CP) precedes each of the N symbols, and wherein N is an integer greater than 1. The system further comprises variable gain amplifier (VGA) means for providing a gain when amplifying the input signal. The system further comprises automatic gain control (AGC) means for selectively adjusting the gain of the VGA means during the CP preceding M of the N symbols, wherein M is an integer greater than 1.

In another feature, M=N.

In another feature, a settling time of the VGA means is less than a period of the CP.

In another feature, the AGC means changes the gain of the VGA means based on signal strength of the input signal.

In another feature, the system further comprises channel estimation means for generating a channel estimate for one of the N symbols based on a plurality of the N symbols.

In another feature, the system further comprises gain adjuster means for adjusting gain, wherein the AGC means changes gain of the gain adjuster means in inverse proportion to a change in the gain of the VGA means. The channel estimate is independent of the change in the gain of the VGA means.

In another feature, the channel estimation means updates channel estimates of the N symbols when the AGC means changes the gain of the VGA means.

In another feature, when signal strength of the input signal changes by a factor of F, the AGC means changes the gain of the VGA means by (10 log F) and the channel estimation means updates channel estimates of the N symbols, where F is an integer greater than 2. The channel estimation means updates the channel estimates using a binary shift operation.

In another feature, the system further comprises gain adjuster means for adjusting gain, wherein when the AGC means changes the gain of the VGA means by G dB, the AGC means changes gain of the gain adjuster means by ((−G)+((Round(G/(10 log F)))*(10 log F)))dB, and the channel estimation means updates channel estimates of the N symbols when signal strength of the input signal changes by a factor of F, where F is an integer greater than 1.

In another feature, an OFDM receiver comprises the system and further comprises decoder means for decoding the N symbols without the CP.

In another feature, the decoder means generates noise variance correction based on information generated by the AGC means.

In still other features, a computer program executed by a processor comprises receiving an input signal that includes frames of N symbols modulated using orthogonal frequency division multiplexing (OFDM), wherein a cyclic prefix (CP) precedes each of the N symbols, and wherein N is an integer greater than 1. The computer program further comprises providing a variable gain amplifier (VGA) having a gain when amplifying the input signal. The computer program further comprises selectively adjusting the gain of the VGA during the CP preceding M of the N symbols by providing automatic gain control (AGC), wherein M is an integer greater than 1.

In another feature, M=N.

In another feature, the computer program further comprises providing the VGA having a settling time less than a period of the CP.

In another feature, the computer program further comprises changing the gain of the VGA based on signal strength of the input signal by using the AGC.

In another feature, the computer program further comprises generating a channel estimate for one of the N symbols based on a plurality of the N symbols.

In another feature, the computer program further comprises providing a gain adjuster module and changing gain of the gain adjuster module in inverse proportion to a change in the gain of the VGA by using the AGC. The channel estimate is independent of the change in the gain of the VGA.

In another feature, the computer program further comprises updating channel estimates of the N symbols when the AGC changes the gain of the VGA.

In another feature, the computer program further comprises changing the gain of the VGA by (10 log F) using the AGC and updating channel estimates of the N symbols when signal strength of the input signal changes by a factor of F, where F is an integer greater than 2. The computer program further comprises updating the channel estimates using a binary shift operation.

In another feature, the computer program further comprises providing a gain adjuster module, changing gain of the gain adjuster module by ((−G)+((Round(G/(10 log F)))*(10 log F)))dB by using the AGC when the gain of the VGA is changed by G dB, and updating channel estimates of the N symbols when signal strength of the input signal changes by a factor of F, where F is an integer greater than 1.

In another feature, the computer program further comprises decoding the N symbols without the CP.

In another feature, the computer program further comprises generating noise variance correction based on information generated by the AGC.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2B is a functional block diagram of an exemplary base station utilized in the system of FIG. 2A;

FIG. 2C is a functional block diagram of an exemplary mobile station utilized in the system of FIG. 2A;

FIG. 9 is a table showing characteristics of different AGC tracking systems according to the present disclosure;

DETAILED DESCRIPTION

Figure 1:
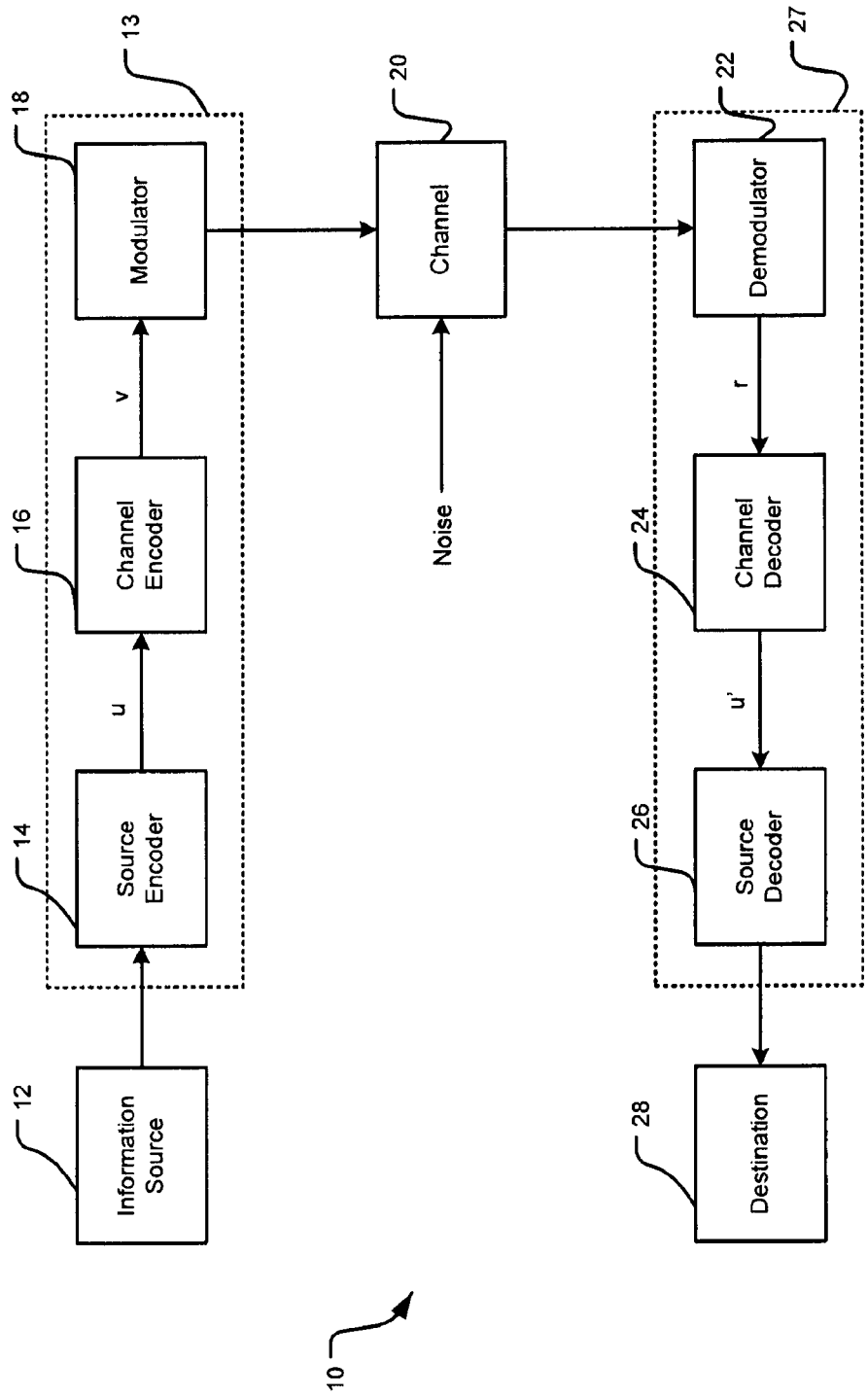
FIG. 1 is a functional block diagram of an exemplary communication system according to the prior art.
Figure 2A:
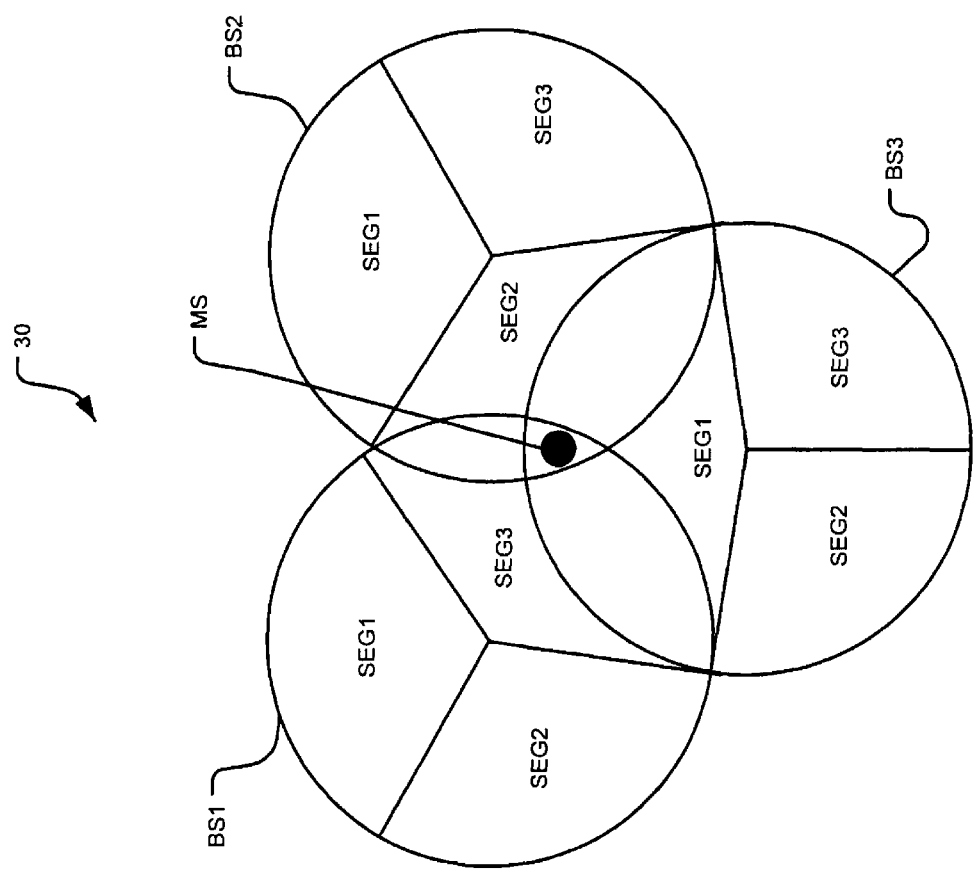
FIG. 2A is a schematic representation of an exemplary wireless communication system comprising three base stations and a mobile station according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
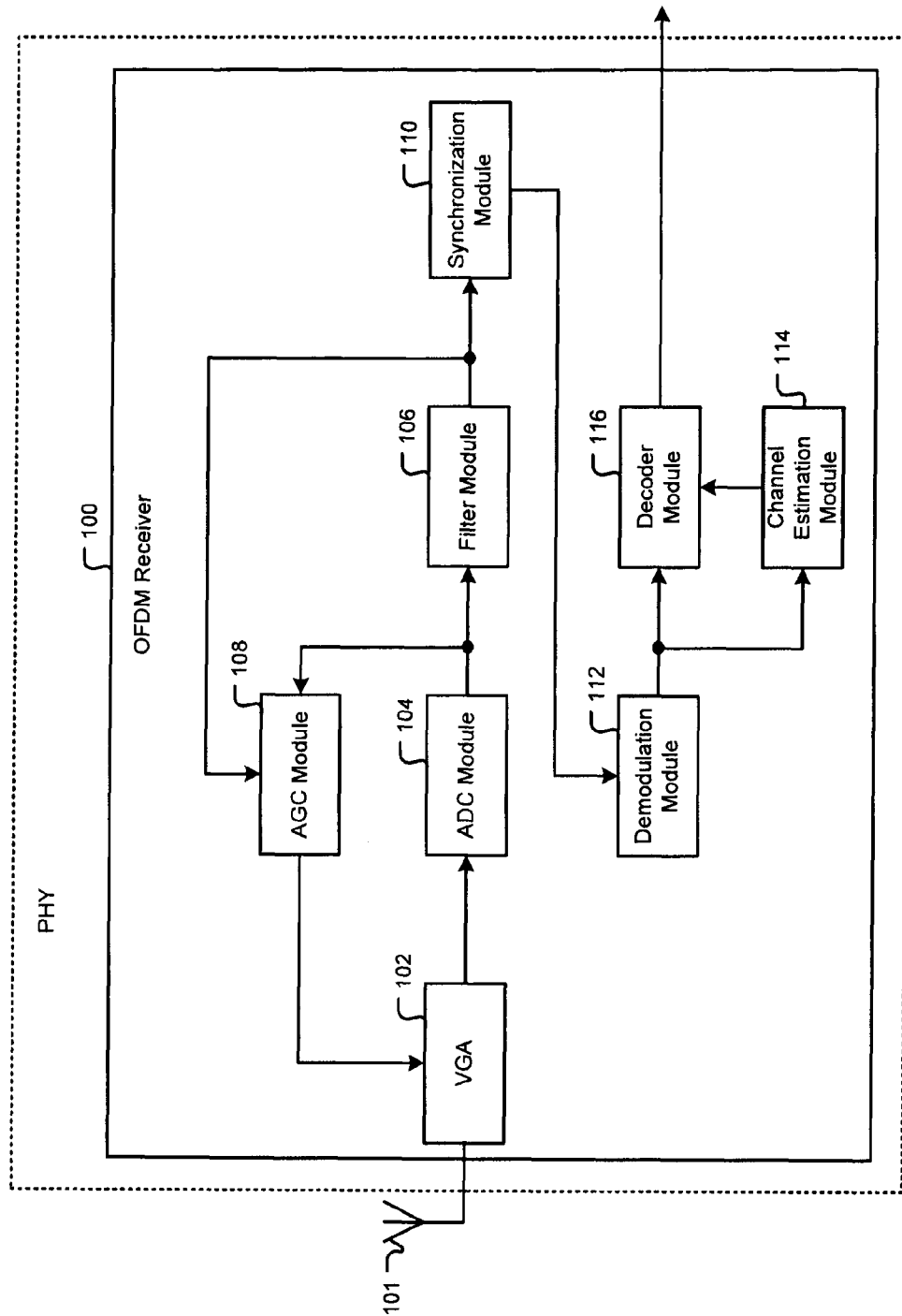
FIG. 3 is a functional block diagram of an exemplary receiver of an orthogonal frequency division multiplexing access (OFDMA) system.

Referring now to FIG. 3, a physical layer (PHY) device comprising a receiver 100 that receives input signals modulated using orthogonal frequency domain multiplexing (OFDM) is shown. The receiver 100 comprises an antenna 101, a variable gain amplifier (VGA) 102, an analog-to-digital converter (ADC) module, a filter module 106, an automatic gain control (AGC) module 108, a synchronization module 110, a demodulation module 112, a channel estimation module 114, and a decoder module 116.

The receiver 100 receives input signals modulated using OFDM via the antenna 101. The VGA 102 amplifies the input signals. The ADC module 104 converts the output of the VGA 102 from analog to digital format. The filter module 106 filters the output of the ADC module 104. The gain of the VGA 102 varies based on the strength of the input signals. The AGC module 108 controls the gain of the VGA 102 based on feedback received from the ADC module 104 and/or the filter module 106. The synchronization module 110 performs symbol timing and carrier frequency synchronization. The demodulation module 112 demodulates the output of the synchronization module 110. The channel estimation module 114 generates channels estimates of OFDM symbols. The decoder module 116 decodes the OFDM symbols and generates data.

Figure 4:
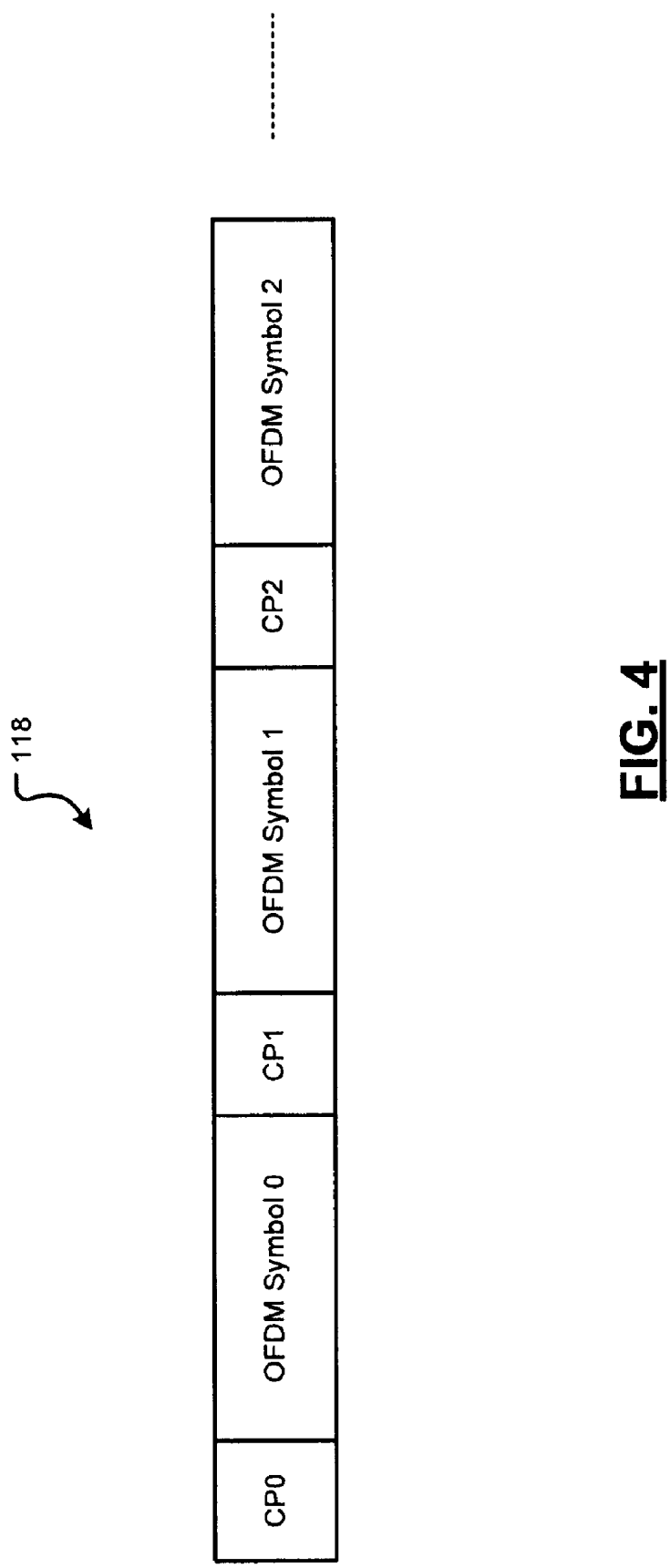
FIG. 4 depicts a frame of OFDM symbols.

Referring now to FIG. 4, the input signals comprise frames of OFDM symbols. A frame 118 includes a plurality of OFDM symbols. Each OFDM symbol includes a useful portion preceded by a cyclic prefix (CP). The CP is a copy of the useful portion of the OFDM symbol. The CP is used to perform synchronization and channel estimation. Additionally, the CP guards the useful portion of the OFDM symbol. Generally, the OFDM symbol can be decoded reliably even if the CP of the OFDM symbol is corrupted. Thus, the CP is redundant.

Typically, the AGC module 108 tracks the gain of the VGA 102 on a per frame basis. This is because the settling time of the gain of the VGA 102 is generally long since the VGA 102 comprises analog devices with long settling times. The long settling time of the VGA 102 may cause loss of data if the gain of the VGA 102 is changed during the frame. Accordingly, the gain of the AGC module 108 is generally set at the beginning of each frame and is left unchanged for the duration of the frame.

The signal strength and channel gain of the input signals, however, may vary during the frame. If the gain of the VGA 102 is not changed based on variations in the signal strength and channel gain of the input signals during a frame, the ADC module 104 may need to have channel fading margin and large dynamic range. Designing the ADC module 104 with channel fading margin and large dynamic range can be challenging.

Instead, the gain of the VGA 102 can be changed during the CP if the settling time of the gain of the VGA 102 is less than the duration of the CP. If the gain of the VGA 102 is changed at the beginning of the CP, and if the gain of the VGA 102 settles before the end of the CP, the channel fading margin and the dynamic range of the ADC module 104 can be relaxed. Since the CP is redundant, the data in the OFDM symbol can be decoded even if CP is utilized for changing the gain of the VGA 102.

The AGC module 108 can track the gain of the VGA 102 in different ways depending on whether the OFDM receivers generate channel estimates using every OFDM symbol or using multiple OFDM symbols in the frame. When channel estimation for a given OFDM symbol is performed using current OFDM symbols, the input signals are processed on a symbol-by-symbol basis, and no gain changes are performed during subsequent signal processing if the AGC module 108 changes the gain of the VGA 102.

When channel estimation is performed using multiple OFDM symbols, channel estimates for multiple OFDM symbols may be averaged to improve the accuracy of the channel estimation. Additionally, a digital gain adjuster module may be used to compensate changes in the gain of the VGA 102 so that the channel estimation and subsequent signal processing are unaffected by the changes in the gain of the VGA 102.

Referring now to FIGS. 5-8, four AGC tracking systems are shown wherein channel estimation for a given OFDM symbol is performed using multiple OFDM symbols. While the four AGC tracking systems have different channel fading margin, quantization noise, and computational complexity, two elements are common to all four AGC tracking systems: First, the AGC module changes the gain of the VGA during the CP of every OFDM symbol. And second, the channel estimates excludes effects of analog gain variation by digital gain adjustment, which may be performed either explicitly by the digital gain adjuster module or implicitly by channel estimation scaling. For example, when the digital gain adjuster module is used, the AGC module changes the gain of the digital gain adjuster module by an amount that is equal and opposite to the amount by which the gain of the VGA is changed so that the net change in the gain of the OFDM receiver is zero. Additionally, all four AGC tracking systems perform optimally when the decoder module computes noise variance correction based on information passed from the AGC module to the decoder module.

Figure 5:
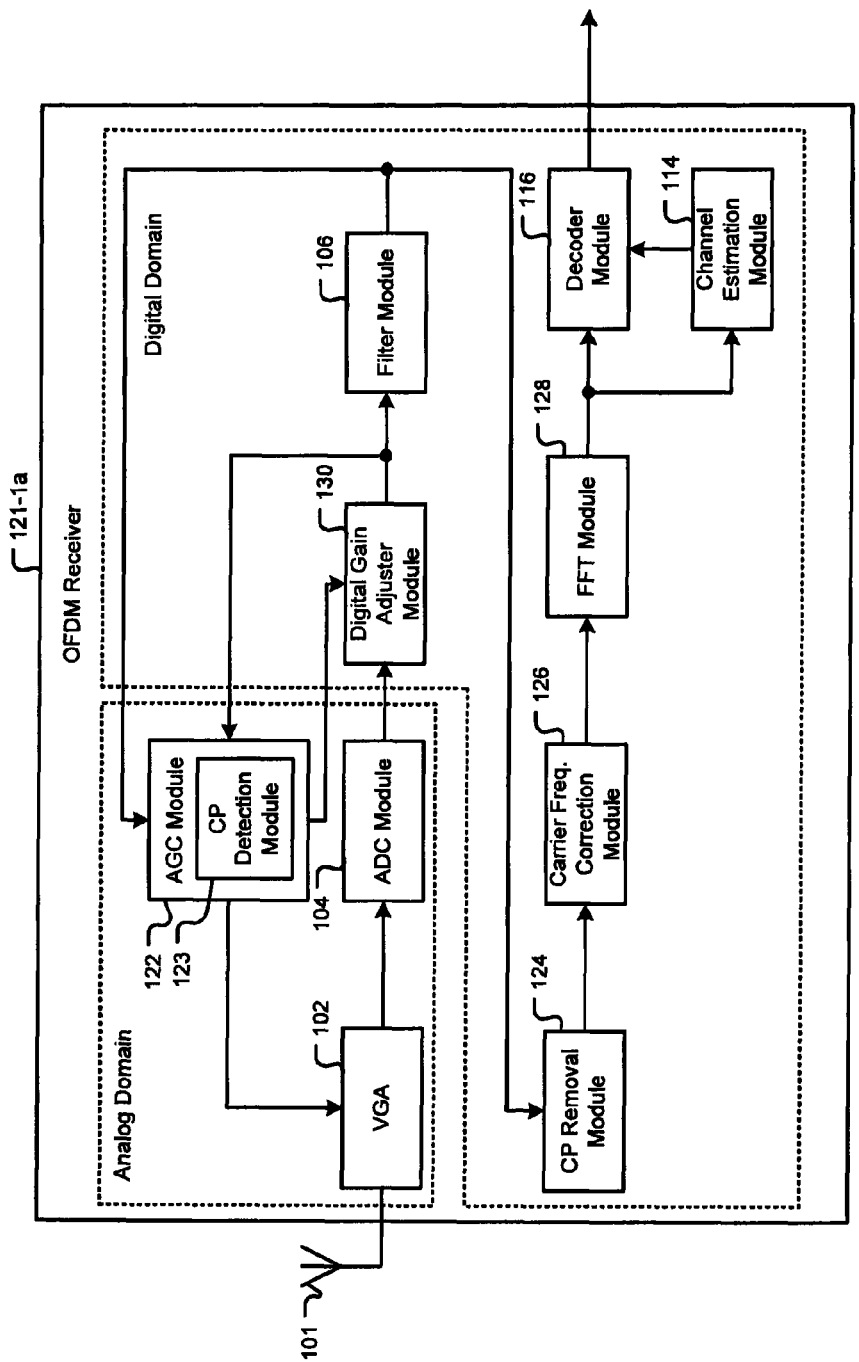
FIGS. 5 and 6 are functional block diagrams of OFDM receivers that generate channel estimates for OFDM symbols using multiple OFDM symbols and that utilize AGC tracking systems according to the present disclosure.
Figure 6:
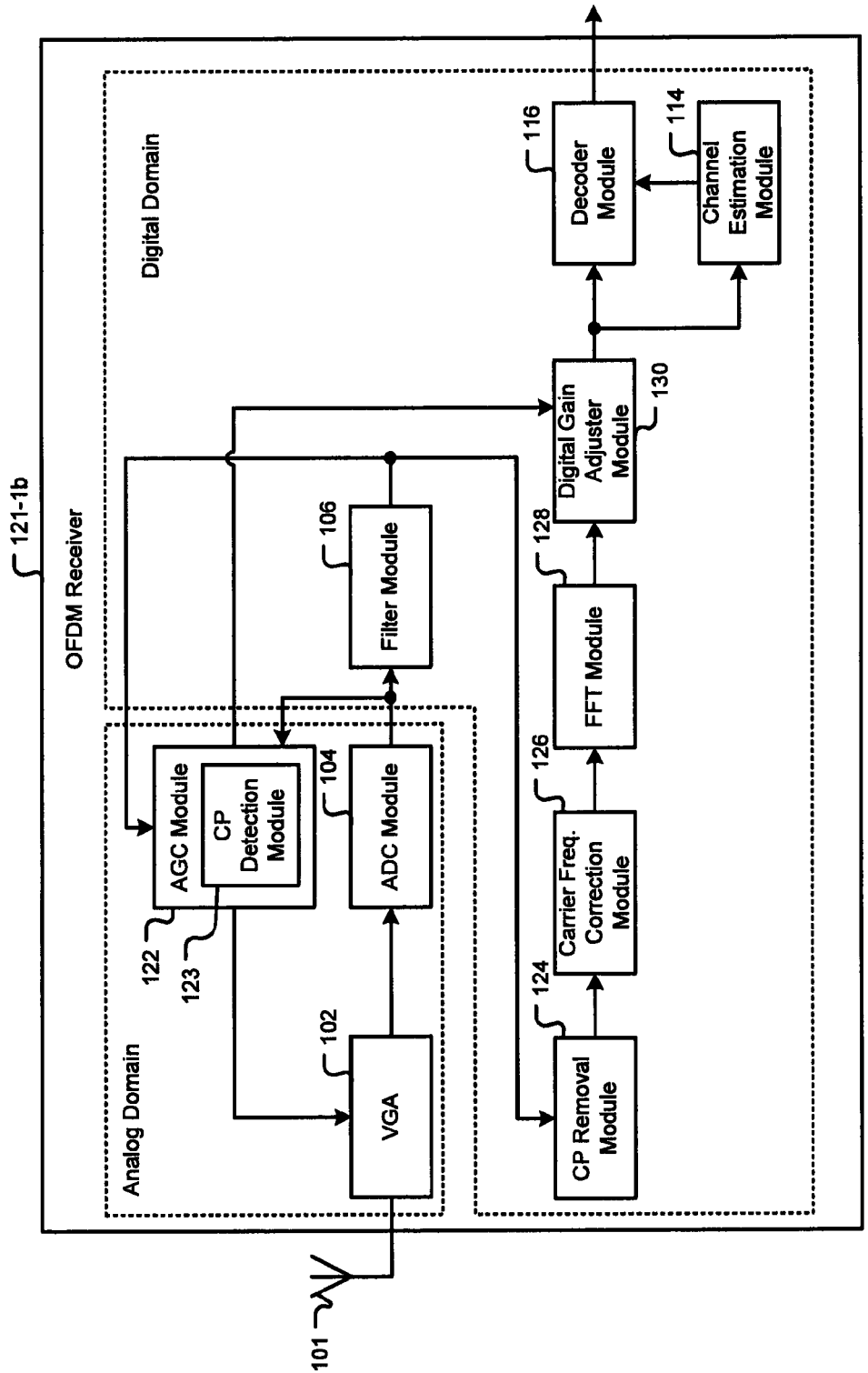

In FIGS. 5 and 6, two configurations of a first AGC tracking system utilizing a digital gain adjuster module 130 are shown wherein channel estimation for a given OFDM symbol is performed using multiple OFDM symbols. In FIG. 5, an OFDM receiver 121-1a comprises the antenna 101, the VGA 102, the ADC module 104, the filter module 106, an AGC module 122, a CP removal module 124, a carrier frequency correction module 126, a Fourier Frequency Transform (FFT) module 128, the channel estimation module 114, the decoder module 116, and the digital gain adjuster module 130.

The AGC module 122 changes the gain of the VGA 102 at the beginning of CP of each OFDM symbol. The AGC module 122 comprises a CP detection module 123 that detects the beginning of the CP of each OFDM symbol based on the feedback received from the filter module 106. Based on the feedback, the AGC module 122 changes the gain of the VGA 102 during the CP. The gain of the VGA 102 settles before the end of the CP.

More specifically, the output of the ADC module 104 is input to the digital gain adjuster module 130 instead of the AGC module 122. Additionally, the digital gain adjuster module 130 receives a control signal from the AGC module 122. The control signal changes the gain of the digital gain adjuster module 130 by an amount that is equal and opposite to the amount by which the AGC module 122 changes the gain of the VGA 102. The digital gain adjuster module 130 generates an output that is fed back to the AGC module 122 and input to the filter module 106.

Depending on the variation in the signal strength of the input signal, the AGC module 122 increases or decreases the gain of the VGA 102. When the AGC module 122 increases the gain of the VGA 102 by an amount G1, the AGC module 122 decreases the gain of the digital gain adjuster module 130 by the amount G1. When the AGC module 122 decreases the gain of the VGA 102 by an amount G2, the AGC module 122 increases the gain of the digital gain adjuster module 130 by the amount G2. Thus, the net change in the gain of the OFDM receiver 121-1a is zero. The channel estimation module 114 generates channel estimates for every symbol normally and independently of the changes in the gain of the VGA 102. That is, the channel estimates are unaffected by and are independent of the changes in the gain of the VGA 102.

Generally, OFDM receivers can perform synchronization either using CP or using frequency domain (FD) techniques. Typically, the CP-based synchronization is performed before FFT operation and offers improved data-acquisition relative to FD-based synchronization. The FD-based synchronization is performed after the FFT operation and is more accurate than the CP-based synchronization.

In the OFDM receiver 121-1a, since CP is utilized for AGC tracking, the CP removal module 124 discards the CP, and FD-synchronization is performed in the digital domain of the OFDM receiver 121-1a. Specifically, the carrier frequency correction module 126 corrects any carrier frequency offset (CFO) that may be present in the output generated by the filter module 106. The FFT module 128 performs FFT operation on the output of the frequency correction module 126. The channel estimation module 114 generates channel estimates for each OFDM symbol.

The decoder module 116 decodes each OFDM symbol. Specifically, the decoder module 116 decodes each OFDM symbol without the information that would otherwise be contained in the CP. That is, the decoder module 116 decodes each OFDM symbol independently of the CP. Additionally, the decoder module 116 computes a noise variance correction based on information generated and communicated by the AGC module 122.

In FIG. 6, an OFDM receiver 121-1b is shown wherein the digital gain adjuster module 130 precedes the channel estimation module 114 and the decoder module 116. In this configuration, the quantization noise is reduced for all modules that precede the digital gain adjuster module 130. Accordingly, the configuration shown in FIG. 6 is better than the configuration shown in FIG. 5.

Figure 7:
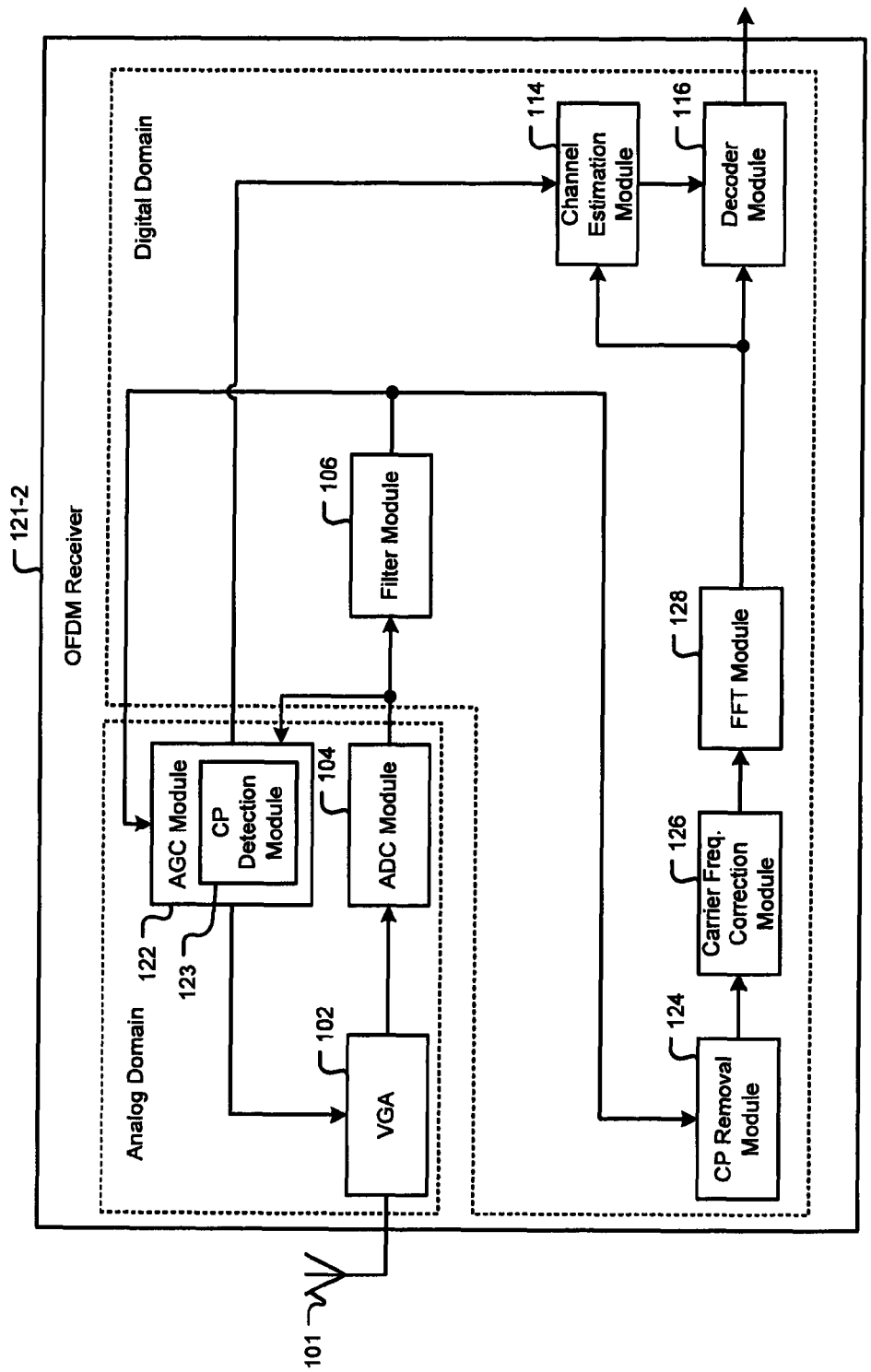
FIGS. 7 and 8 are functional block diagrams of OFDM receivers that generate channel estimates for OFDM symbols using multiple OFDM symbols and that utilize AGC tracking systems according to the present disclosure.

In FIG. 7, a second AGC tracking system is shown wherein channel estimation for a given OFDM symbol is performed using multiple OFDM symbols. In an OFDM receiver 121-2, when the AGC module 122 changes the gain of the VGA 102, the change in the gain of the VGA 102 is not compensated during subsequent signal processing. Instead, the AGC module 122 generates a control signal that is input to the channel estimation module 114. The channel estimation module 114 updates the channel estimates for each symbol based on the control signal. While this increases the computational complexity of the channel estimation module 114, the quantization noise of the OFDM receiver 121-2 is reduced compared to the OFDM receiver 121-1a and 121-1b.

In a third AGC tracking system, which is a variation of the second AGC tracking system of FIG. 7, the AGC module 122 changes the gain of the VGA 102 only when the signal strength of the input signal changes by more than 3 dB (i.e., by more than a factor of 2 since 10 log 2=3 dB). For example, the AGC module 122 changes the gain of the VGA 102 only when the signal strength more than doubles or halves. Thus, the gain of the VGA 102 is changed only when the change in the gain from a previously set gain value (i.e., a gain adjustment step) is more than 3 dB. Additionally, the AGC module 122 generates a control signal that is input to the channel estimation module 114. Based on the control signal, the channel estimation module 114 updates the channel estimates.

This reduces the computational complexity of the channel estimation module 114 since the channel estimates can be updated by a simple binary shift operation instead of multiplication or division when the gain of the VGA 102 is changed in steps of 3 dB. The ADC module 104, however, needs to have a 3 dB channel fading margin to withstand the changes in the gain of the VGA 102 in 3 dB steps.

Figure 8:
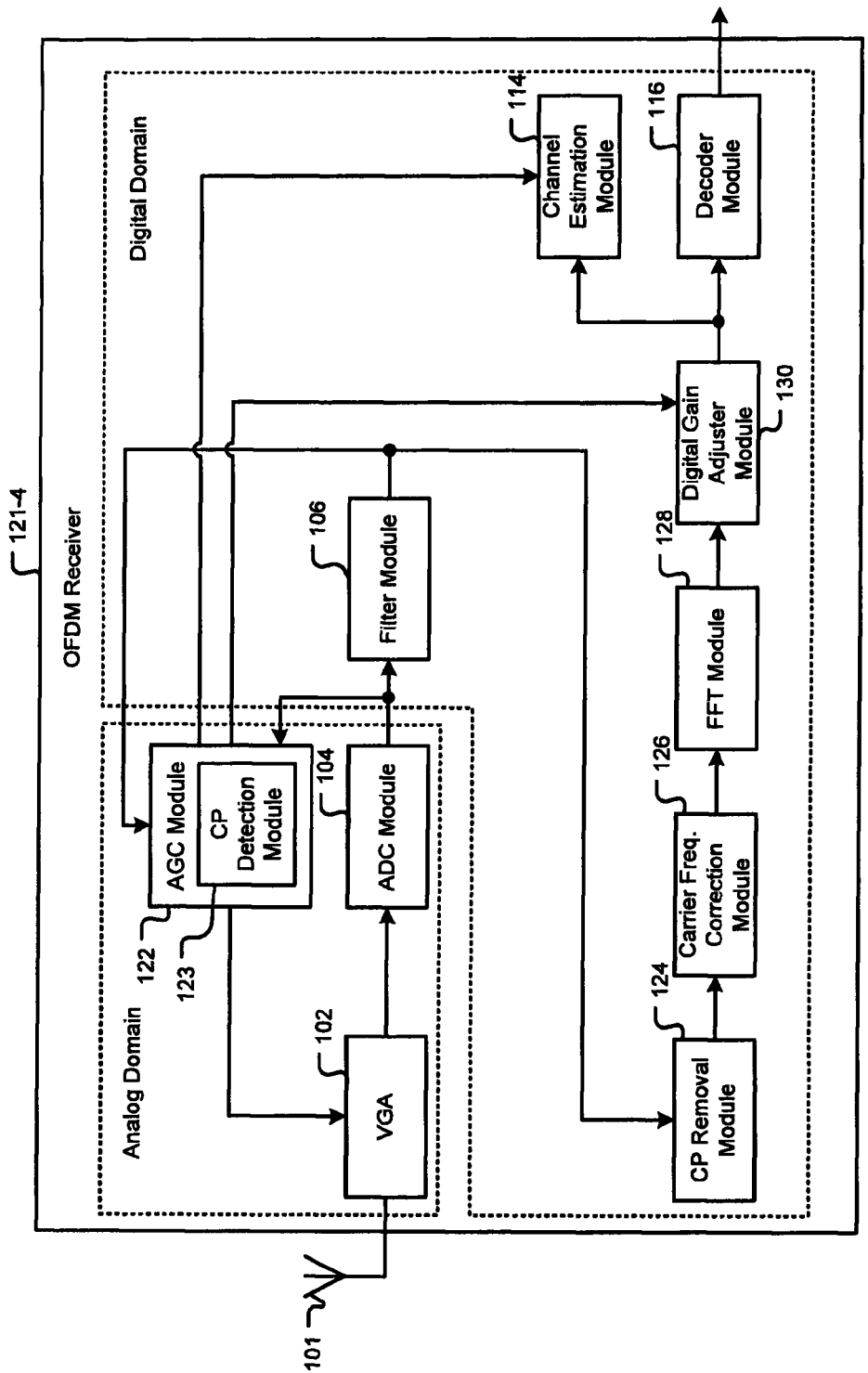

In FIG. 8, a fourth AGC tracking system is shown wherein channel estimation for a given OFDM symbol is performed using multiple OFDM symbols. The fourth AGC tracking system is a combination of the first AGC tracking system of FIG. 6 and the third AGC tracking system of FIG. 7. Specifically, in an OFDM receiver 121-4, the digital gain adjuster module 130 is used as shown to compensate the changes in the gain of the VGA 102, and the channel estimation module 114 updates the channel estimates based on feedback received from the AGC module 122.

The AGC module 122 changes the gain of the VGA 102 during the CP of each OFDM symbol by an amount G. The AGC module 122 determines or estimates the amount G based on the signal strength of the input signal, which in turn is determined based on the feedback received from the ADC module 104 and the filter module 106.

When the AGC module 122 changes the gain of the VGA 102 by G dB, the AGC module 122 generates two control signals. A first control signal changes the gain of the digital gain adjuster module 130 by an amount equal to $((-G)+((\text{Round}(G/(10 \log 2)))*(10 \log 2)))$dB, where 10 log 2 is approximately equal to 3 dB. This obviates the need for the ADC module 104 to have any channel fading margin.

Additionally, based on a second control signal generated by the AGC module 122, the channel estimation module 114 updates the channel estimates only when the AGC module 122 changes the gain of the VGA 102 by a total of 3 dB. The channel estimation module 114 does not update the channel estimates when G<3 dB. This reduces the computational complexity of the channel estimation module 114 since the channel estimates can be updated by a simple binary shift operation when the gain of the VGA 102 is changed by a total of 3 dB. The OFDM receiver 121-4, however, has a higher quantization noise than the OFDM receivers utilizing the second or third AGC tracking systems.

Referring now to FIG. 9, a table is shown wherein the four AGC tracking systems where channel estimation is performed using multiple OFDM symbols are compared using three criteria: the channel fading margin rating of the ADC module 104, the quantization noise of the OFDM receiver, and the computational complexity of the channel estimation module 114.

Although the AGC tracking systems shown in FIGS. 5-8 change the gain of the VGA 102 during the CP of every symbol in the frame, the AGC module 122 may determine based on the signal strength of the input signal whether to change the gain of the VGA 102 during the CP preceding every symbol, every other symbol, and so on. Accordingly, if the frame comprises N symbols, the AGC module 122 may change the gain of the VGA 102 M times during the frame, where N and M are integers, N>1, and 1<M≦N.

Figure 10:
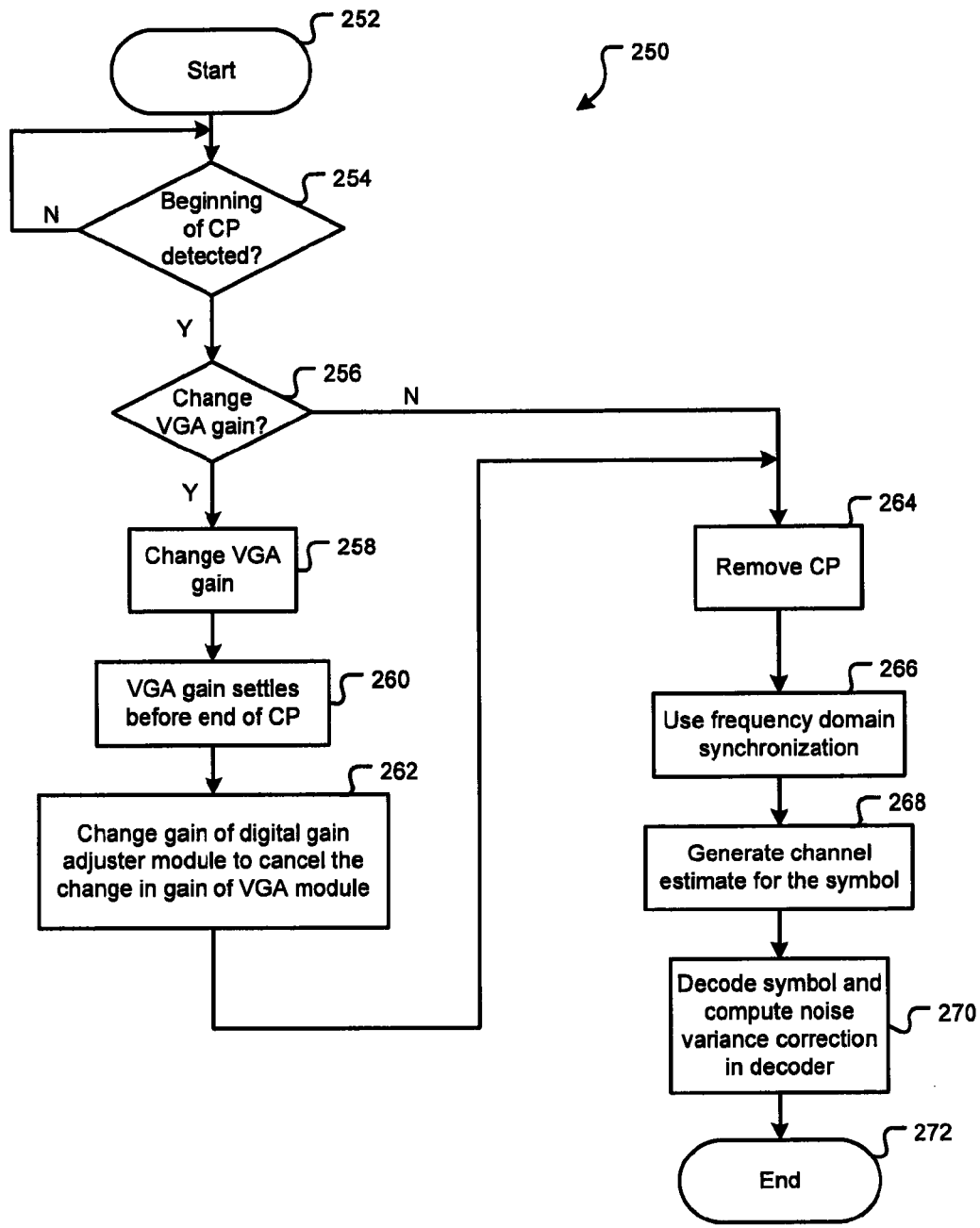
FIGS. 10-14 are flowcharts of different AGC tracking systems according to the present disclosure.

Referring now to FIG. 10, a method 250 for tracking AGC gain is shown when channel estimates for given OFDM symbols are generated using multiple OFDM symbols. The method 250 begins in step 252. The CP detection module 123 detects the beginning of the CP for a given OFDM symbol in step 254. The AGC module 122 determines in step 256 whether to change the gain of the VGA 102 based on the feedback received from the filter module 106 and/or the ADC module 104.

If the result of step 256 is true, the AGC module 122 changes the gain of the VGA 102 at the beginning of the CP in step 258, and the gain of the VGA 102 settles before the end of the CP in step 260. The AGC module 122 generates a control signal that changes the gain of the digital gain adjuster module 130 in step 262 to cancel the effect of change in the gain of the VGA 102 during subsequent signal processing.

Subsequently, or if the result of step 256 is false, the CP removal module 124 removes the CP in step 264. The FFT module 128 performs FD synchronization in step 266. The channel estimation module 114 generates a channel estimate for the OFDM symbol in step 268. The decoder module 116 decodes the OFDM symbol and computes noise variance correction in step 270. The method 250 ends in step 272.

Figure 11:
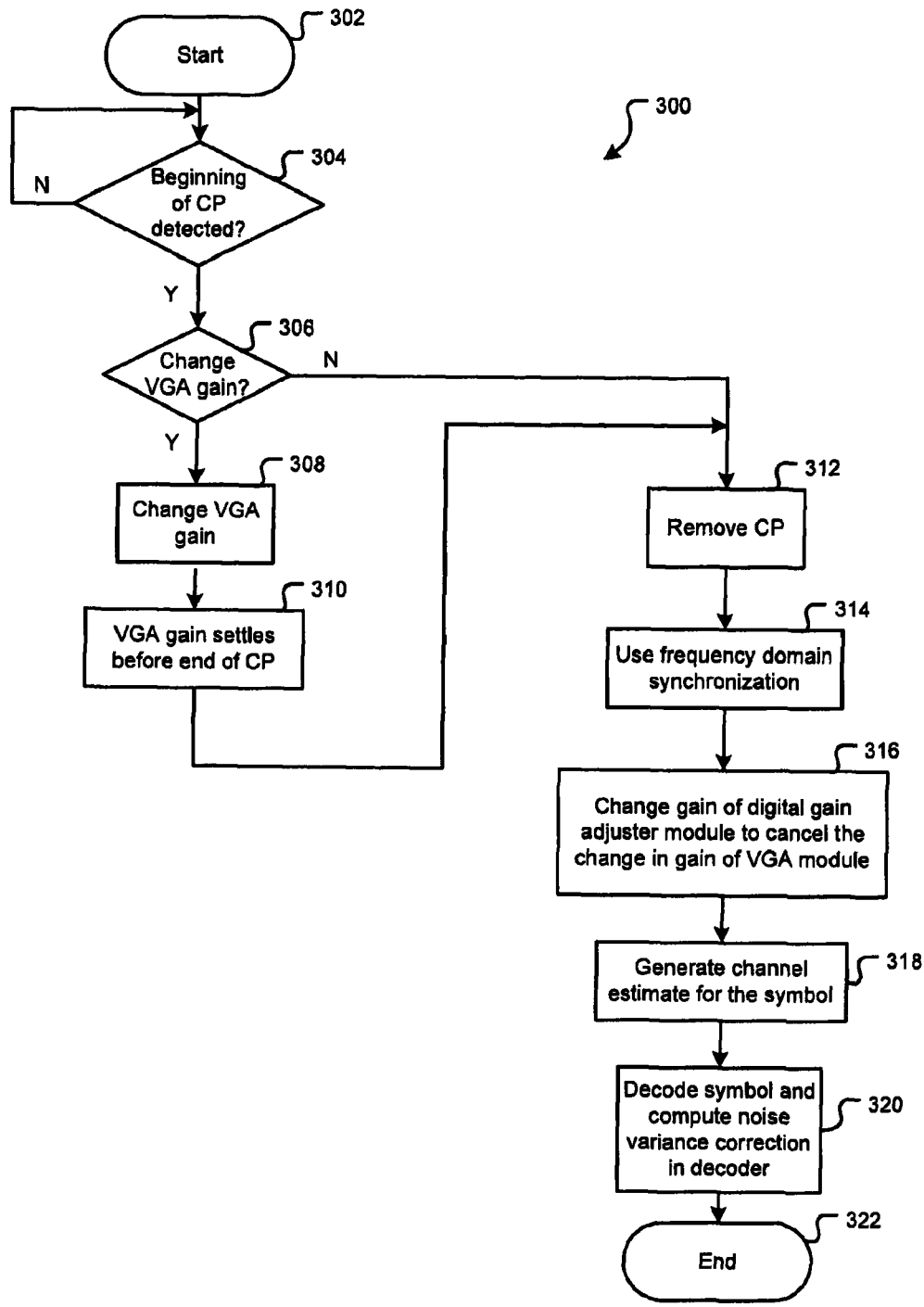

Referring now to FIG. 11, a method 300 for tracking AGC gain is shown when channel estimates for given OFDM symbols are generated using multiple OFDM symbols. The method 300 begins in step 302. The CP detection module 123 detects the beginning of the CP for a given OFDM symbol in step 304. The AGC module 122 determines in step 306 whether to change the gain of the VGA 102 based on the feedback received from the ADC module 104 and/or the filter module 106.

If the result of step 306 is true, the AGC module 122 changes the gain of the VGA 102 at the beginning of the CP in step 308, and the gain of the VGA 102 settles before the end of the CP in step 310. Subsequently, or if the result of step 306 is false, the CP removal module 124 removes the CP in step 312. The FFT module 128 performs FD synchronization in step 314.

In step 316, the AGC module 122 generates a control signal that changes the gain of the digital gain adjuster module 130 to cancel the effect of change in the gain of the VGA 102 during subsequent signal processing. The channel estimation module 114 generates a channel estimate for the OFDM symbol in step 318. The decoder module 116 decodes the OFDM symbol and computes noise variance correction in step 320. The method 300 ends in step 322.

Figure 12:
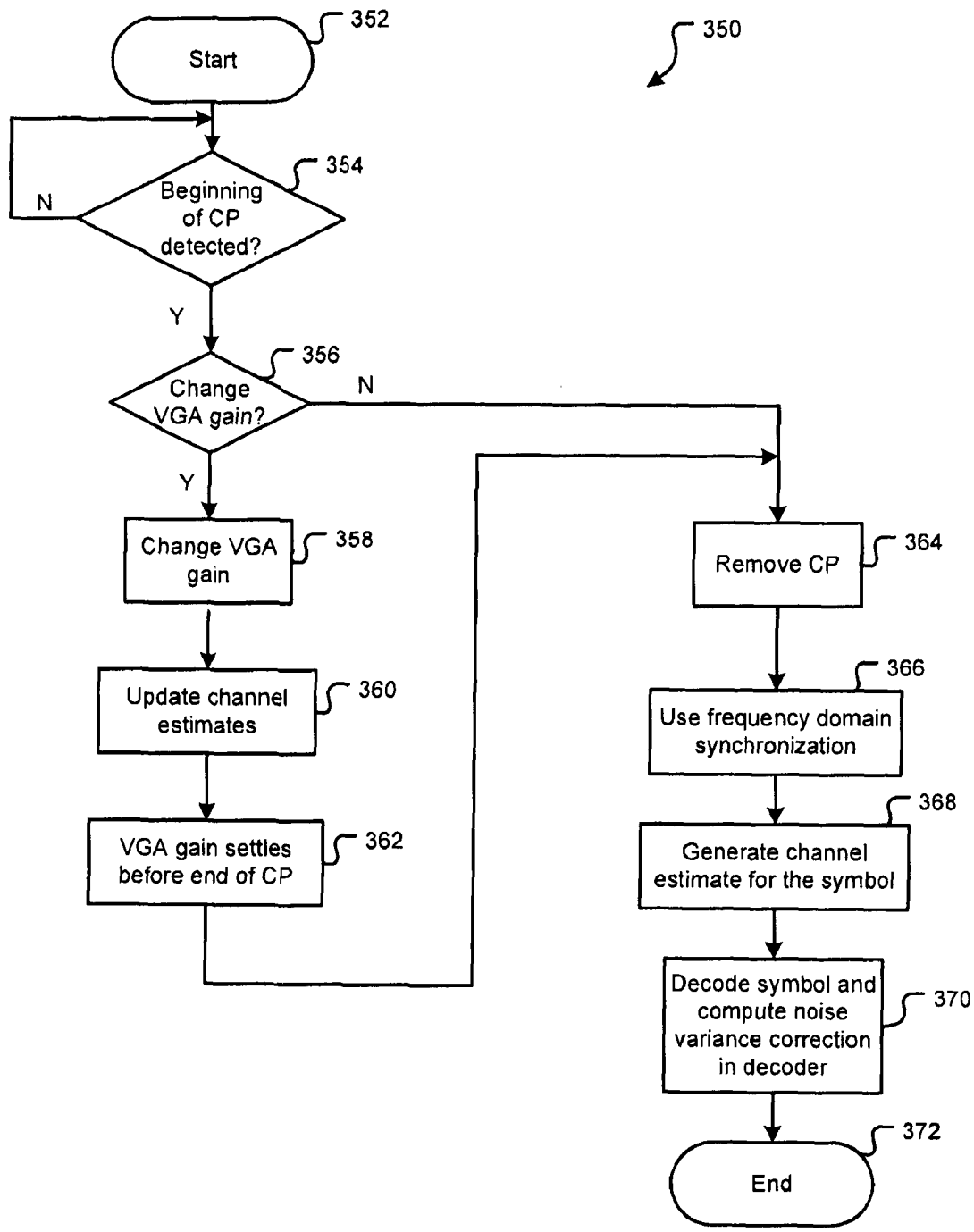

Referring now to FIG. 12, a method 350 for tracking AGC gain is shown when channel estimates for given OFDM symbols are generated using multiple OFDM symbols. The method 350 begins in step 352. The CP detection module 123 detects the beginning of the CP for a given OFDM symbol in step 354. The AGC module 122 determines in step 356 whether to change the gain of the VGA 102 based on the feedback received from the ADC module 104 and/or the filter module 106.

If the result of step 356 is true, the AGC module 122 changes the gain of the VGA 102 at the beginning of the CP in step 358. The AGC module 122 generates a control signal based on which the channel estimation module 114 updates the channel estimates in step 360. The gain of the VGA 102 settles before the end of the CP in step 362.

Subsequently, or if the result of step 356 is false, the CP removal module 124 removes the CP in step 364. The FFT module 128 performs FD synchronization in step 366. The channel estimation module 114 generates a channel estimate for the OFDM symbol in step 368. The decoder module 116 decodes the OFDM symbol and computes noise variance correction in step 370. The method 350 ends in step 372.

Figure 13:
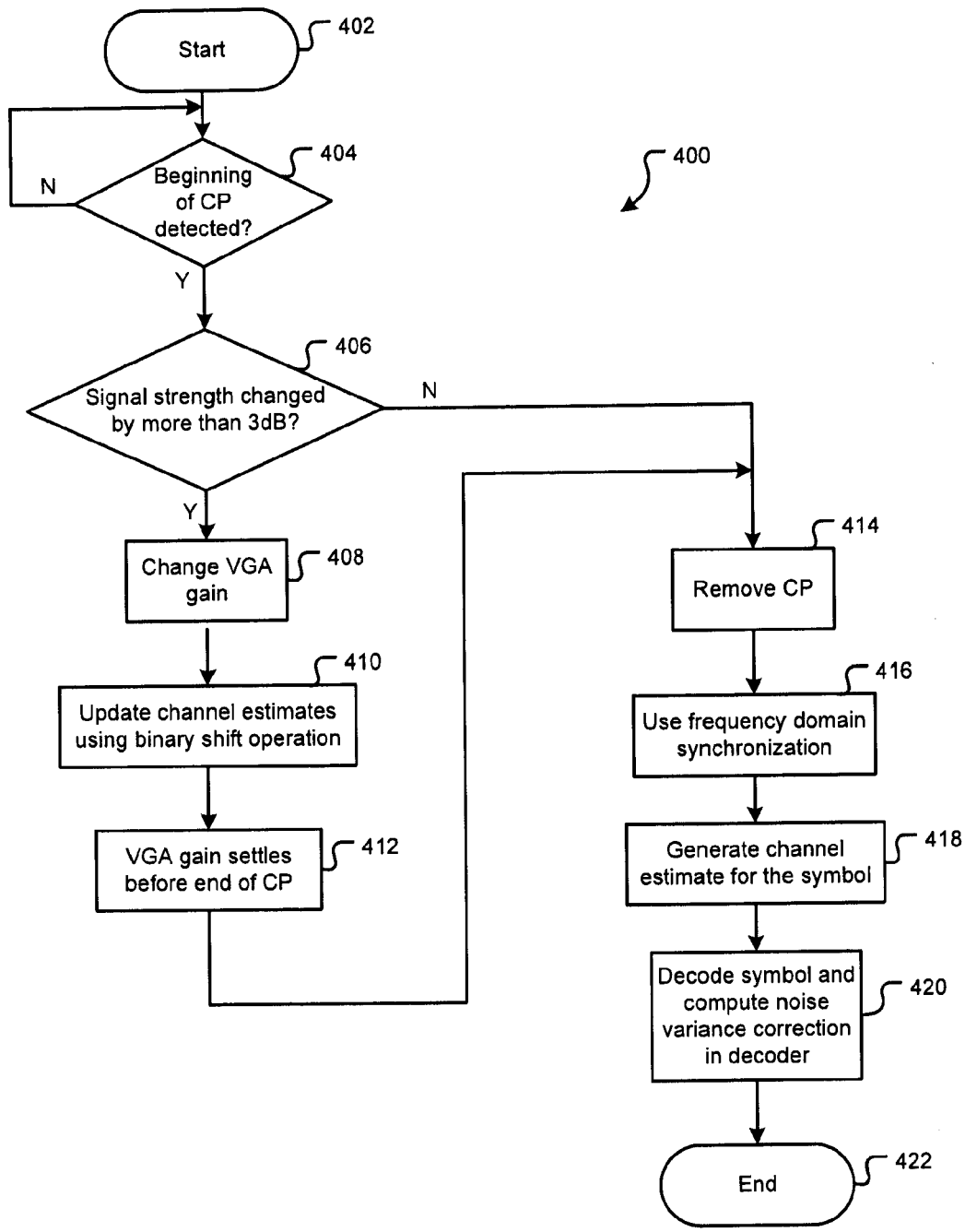

Referring now to FIG. 13, a method 400 for tracking AGC gain is shown when channel estimates for given OFDM symbols are generated using multiple OFDM symbols. The method 400 begins in step 402. The CP detection module 123 detects the beginning of the CP for a given OFDM symbol in step 404. The AGC module 122 determines in step 406 whether the signal strength of the input signal changed by at least 3 dB or a factor of 2 (e.g., more than doubled or halved) based on the feedback received from the ADC module 104 and/or the filter module 106.

If the result of step 406 is true, the AGC module 122 changes the gain of the VGA 102 at the beginning of the CP in step 408. The AGC module 122 generates a control signal based on which the channel estimation module 114 updates the channel estimates using a binary shift operation in step 410. The gain of the VGA 102 settles before the end of the CP in step 412.

Subsequently, or if the result of step 406 is false, the CP removal module 124 removes the CP in step 414. The FFT module 128 performs FD synchronization in step 416. The channel estimation module 114 generates a channel estimate for the OFDM symbol in step 418. The decoder module 116 decodes the OFDM symbol and computes noise variance correction in step 420. The method 400 ends in step 422.

Figure 14:
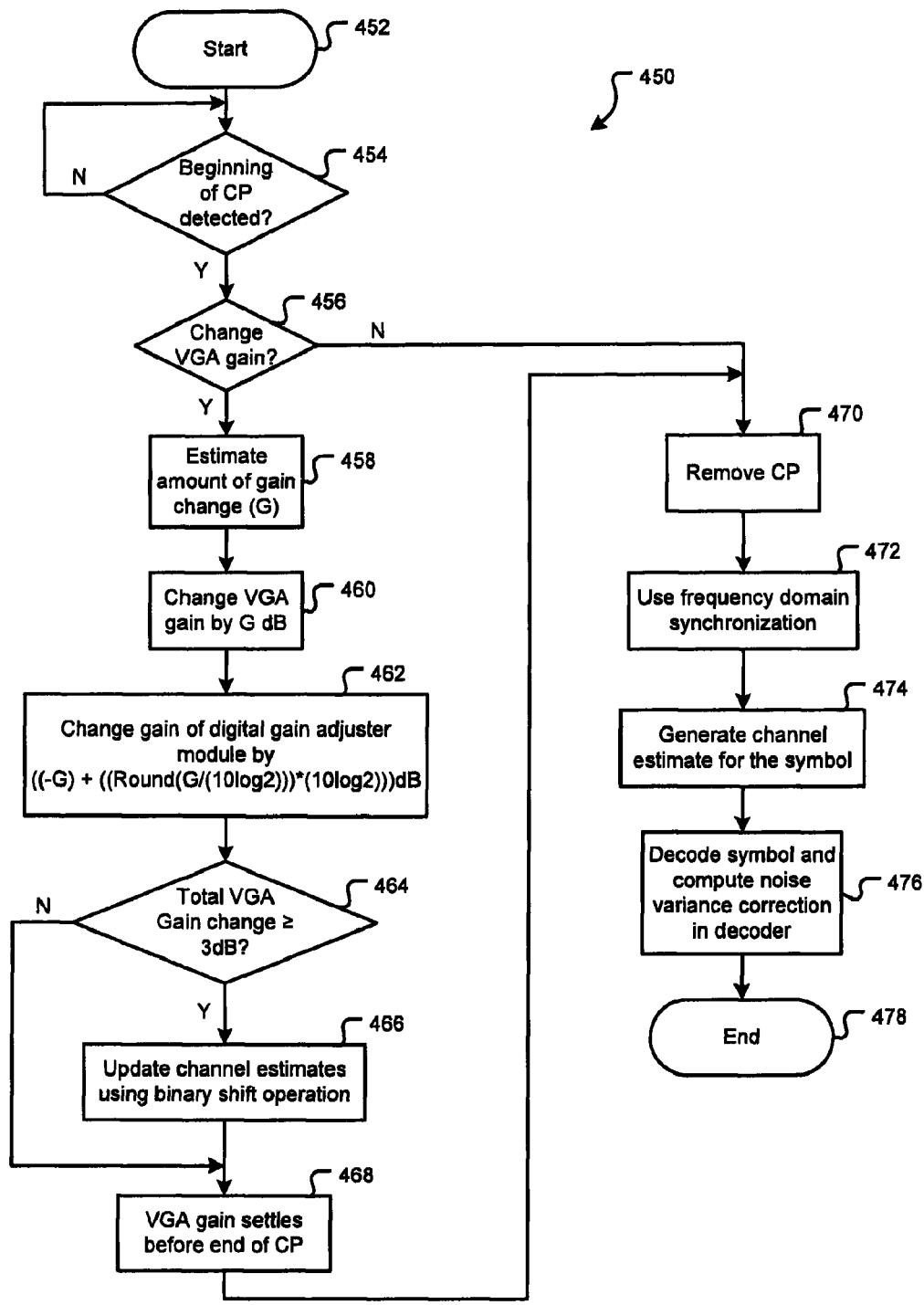

Referring now to FIG. 14, a method 450 for tracking AGC gain is shown when channel estimates for given OFDM symbols are generated using multiple OFDM symbols. The method 450 begins in step 452. The CP detection module 123 detects the beginning of the CP for a given OFDM symbol in step 454. The AGC module 122 determines in step 456 whether to change the gain of the VGA 102 based on the feedback received from the ADC module 104 and/or the filter module 106.

If the result of step 456 is true, the AGC module 122 estimates the amount G by which to change the gain of the VGA 102 in step 458. The AGC module 122 changes the gain of the VGA 102 by G dB in step 460. The AGC module 122 generates a control signal based on which the gain of the digital gain adjuster module 130 is changed by an amount equal to ((−G)+Round((G/3 dB)*3 dB)) in step 462.

The AGC module 122 determines in step 464 if the total amount by which the gain of the VGA 102 is changed is greater than or equal to 3 dB. If the result of step 464 is true, the AGC module 122 generates a control signal based on which the channel estimation module 114 updates the channel estimates using a binary shift operation in step 366. If the result of step 464 is false, the method 450 skips step 466. The gain of the VGA 102 settles before the end of the CP in step 468.

Subsequently, or if the result of step 456 is false, the CP removal module 124 removes the CP in step 470. The FFT module 128 performs FD synchronization in step 472. The channel estimation module 114 generates a channel estimate for the OFDM symbol in step 474. The decoder module 116 decodes the OFDM symbol and computes noise variance correction in step 476. The method 450 ends in step 478.

Figure 15B:
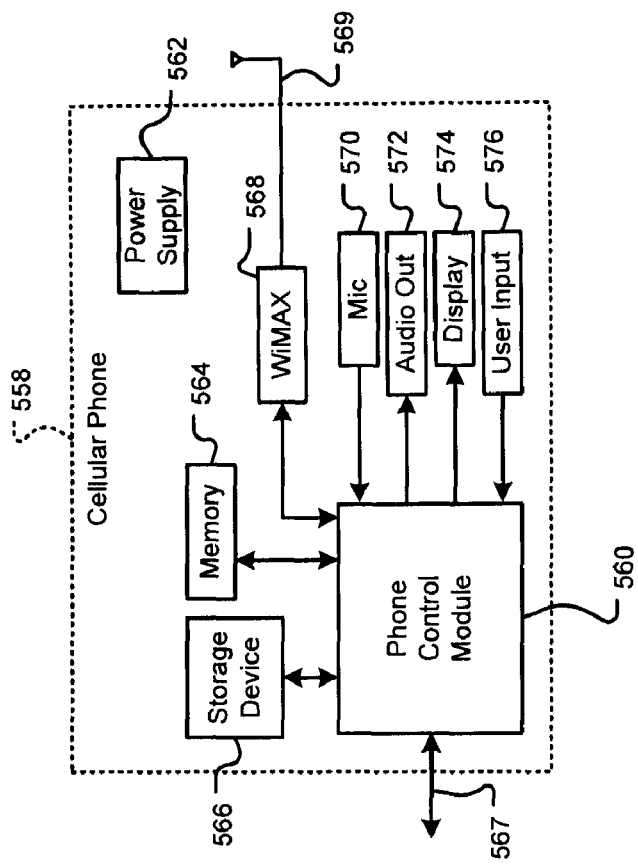
FIG. 15B is a functional block diagram of a cellular phone.
Figure 15A:
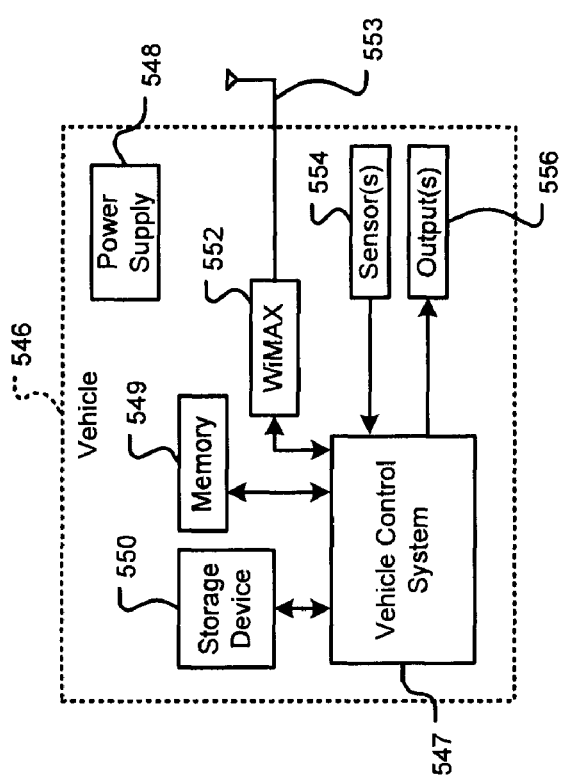
FIG. 15A is a functional block diagram of a vehicle control system.

Referring now to FIG. 15A, the teachings of the disclosure may be implemented in a WiMAX interface 552 of a vehicle 546. The vehicle 546 may include a vehicle control system 547, a power supply 548, memory 549, a storage device 550, and the WiMAX interface 552 and associated antenna 553. The vehicle control system 547 may be a powertrain control system, a body control system, an entertainment control system, an anti-lock braking system (ABS), a navigation system, a telematics system, a lane departure system, an adaptive cruise control system, etc.

The vehicle control system 547 may communicate with one or more sensors 554 and generate one or more output signals 556. The sensors 554 may include temperature sensors, acceleration sensors, pressure sensors, rotational sensors, airflow sensors, etc. The output signals 556 may control engine operating parameters, transmission operating parameters, suspension parameters, etc.

The power supply 548 provides power to the components of the vehicle 546. The vehicle control system 547 may store data in memory 549 and/or the storage device 550. Memory 549 may include random access memory (RAM) and/or nonvolatile memory such as flash memory, phase change memory, or multi-state memory, in which each memory cell has more than two states. The storage device 550 may include an optical storage drive, such as a DVD drive, and/or a hard disk drive (HDD). The vehicle control system 547 may communicate externally using the WiMAX interface 552.

Referring now to FIG. 15B, the teachings of the disclosure can be implemented in a WiMAX interface 568 of a cellular phone 558. The cellular phone 558 includes a phone control module 560, a power supply 562, memory 564, a storage device 566, and a cellular network interface 567. The cellular phone 558 may include the WiMAX interface 568 and associated antenna 569, a microphone 570, an audio output 572 such as a speaker and/or output jack, a display 574, and a user input device 576 such as a keypad and/or pointing device.

The phone control module 560 may receive input signals from the cellular network interface 567, the WiMAX interface 568, the microphone 570, and/or the user input device 576. The phone control module 560 may process signals, including encoding, decoding, filtering, and/or formatting, and generate output signals. The output signals may be communicated to one or more of memory 564, the storage device 566, the cellular network interface 567, the WiMAX interface 568, and the audio output 572.

Memory 564 may include random access memory (RAM) and/or nonvolatile memory such as flash memory, phase change memory, or multi-state memory, in which each memory cell has more than two states. The storage device 566 may include an optical storage drive, such as a DVD drive, and/or a hard disk drive (HDD). The power supply 562 provides power to the components of the cellular phone 558.

Figure 15C:
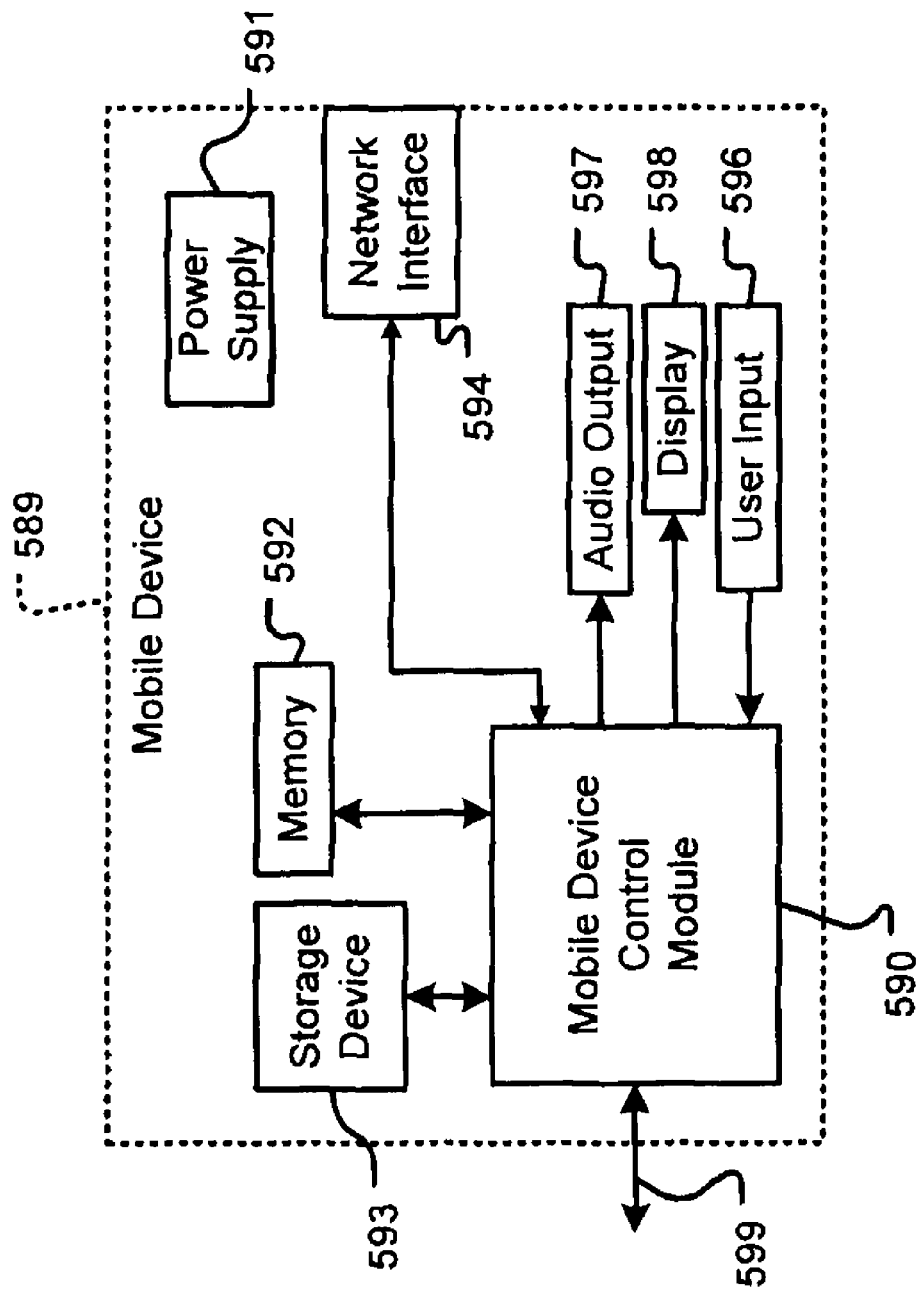
FIG. 15C is a functional block diagram of a mobile device.

Referring now to FIG. 15C, the teachings of the disclosure can be implemented in a network interface 594 of a mobile device 589. The mobile device 489 may include a mobile device control module 590, a power supply 591, memory 592, a storage device 593, the network interface 594, and an external interface 599. The network interface 594 includes a WiMAX interface and an antenna (not shown).

The mobile device control module 590 may receive input signals from the network interface 594 and/or the external interface 599. The external interface 599 may include USB, infrared, and/or Ethernet. The input signals may include compressed audio and/or video, and may be compliant with the MP3 format. Additionally, the mobile device control module 590 may receive input from a user input 596 such as a keypad, touchpad, or individual buttons. The mobile device control module 590 may process input signals, including encoding, decoding, filtering, and/or formatting, and generate output signals.

The mobile device control module 590 may output audio signals to an audio output 597 and video signals to a display 598. The audio output 597 may include a speaker and/or an output jack. The display 598 may present a graphical user interface, which may include menus, icons, etc. The power supply 591 provides power to the components of the mobile device 589. Memory 592 may include random access memory (RAM) and/or nonvolatile memory such as flash memory, phase change memory, or multi-state memory, in which each memory cell has more than two states. The storage device 593 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system comprising:
   an input configured to receive an input signal comprising frames of N symbols modulated using orthogonal frequency division multiplexing (OFDM), wherein a cyclic prefix precedes each of the N symbols, and wherein N is an integer greater than 1;
   a variable gain amplifier (VGA) configured to provide a gain when amplifying the input signal; and
   an automatic gain control (AGC) module configured to selectively adjust the gain of the VGA during the cyclic prefix preceding M of the N symbols, wherein M is an integer greater than 1, and wherein M is selected based on signal strength of the input signal.

2. The system of claim 1, wherein M=N.

3. The system of claim 1, wherein a settling time of the VGA is less than a period of the cyclic prefix.

4. The system of claim 1, wherein the AGC module is configured to change the gain of the VGA based on signal strength of the input signal.

5. The system of claim 1, further comprising a channel estimation module configured to generate a channel estimate for one of the N symbols based on a plurality of the N symbols.

6. The system of claim 5, further comprising a gain adjuster module, wherein the AGC module is configured to change gain of the gain adjuster module in inverse proportion to a change in the gain of the VGA.

7. The system of claim 6, wherein the channel estimate is independent of the change in the gain of the VGA.

8. The system of claim 5, wherein in response to the AGC module changing the gain of the VGA, the channel estimation module is configured to update channel estimates of the N symbols.

9. The system of claim 5, wherein in response to signal strength of the input signal changing by a factor of F, where F is an integer greater than 2:
the AGC module is configured to change the gain of the VGA by (10 log F); and
the channel estimation module is configured to update channel estimates of the N symbols.

10. The system of claim 9, wherein the channel estimation module is configured to update the channel estimates using a binary shift operation.

11. The system of claim 5, further comprising a gain adjuster module, wherein:
in response to the AGC module changing the gain of the VGA by G dB, the AGC module is configured to change gain of the gain adjuster module by ((−G)+((Round(G/(10 log F)))*(10 log F)))dB; and
in response to signal strength of the input signal changing by a factor of F, the channel estimation module is configured to update channel estimates of the N symbols, where F is an integer greater than 1.

12. An OFDM receiver comprising:
the system of claim 1; and
a decoder module configured to decode the N symbols without the cyclic prefix.

13. The OFDM receiver of claim 12, wherein the decoder module is configured to generate noise variance correction based on information generated by the AGC module.

14. A method comprising:
receiving an input signal that includes frames of N symbols modulated using orthogonal frequency division multiplexing (OFDM), wherein a cyclic prefix precedes each of the N symbols, and wherein N is an integer greater than 1;
providing a variable gain amplifier (VGA) having a gain when amplifying the input signal; and
selectively adjusting the gain of the VGA during the cyclic prefix preceding M of the N symbols by providing automatic gain control (AGC), wherein M is an integer greater than 1, and wherein M is selected based on signal strength of the input signal.

15. The method of claim 14, wherein M=N.

16. The method of claim 14, further comprising providing the VGA having a settling time less than a period of the cyclic prefix.

17. The method of claim 14, further comprising changing the gain of the VGA based on signal strength of the input signal by using the AGC.

18. The method of claim 14, further comprising generating a channel estimate for one of the N symbols based on a plurality of the N symbols.

19. The method of claim 18, further comprising:
providing a gain adjuster module; and
changing gain of the gain adjuster module in inverse proportion to a change in the gain of the VGA by using the AGC.

20. The method of claim 19, wherein the channel estimate is independent of the change in the gain of the VGA.

21. The method of claim 18, further comprising updating channel estimates of the N symbols in response to the AGC changing the gain of the VGA.

22. The method of claim 18, further comprising, in response to signal strength of the input signal changes by a factor of F, where F is an integer greater than 2:
changing the gain of the VGA by (10 log F) using the AGC; and
updating channel estimates of the N symbols.

23. The method of claim 22, further comprising updating the channel estimates using a binary shift operation.

24. The method of claim 18, further comprising:
providing a gain adjuster module;
in response to the gain of the VGA changing by G dB, changing gain of the gain adjuster module by ((−G)+((Round(G/(10 log F)))*(10 log F)))dB by using the AGC; and
in response to signal strength of the input signal changing by a factor of F, updating channel estimates of the N symbols, where F is an integer greater than 1.

25. The method of claim 14, further comprising decoding the N symbols without the cyclic prefix.

26. The method of claim 14, further comprising generating noise variance correction based on information generated by the AGC.

* * * * *